US005755891A

United States Patent [19]

Lo et al.

[11] Patent Number: 5,755,891

[45] Date of Patent: May 26, 1998

[54] METHOD FOR POST-ETCHING OF METAL PATTERNS

[75] Inventors: Chi-Hsin Lo, Pin-Jan; Dowson Jang, Tsao Tun Town; Hsueh-Liang Chiu, Myan-Lih, all of Taiwan

[73] Assignee: Taiwan Semiconductor Manufacturing Company Ltd., Hsin-Chu, Taiwan

[21] Appl. No.: 789,214

[22] Filed: Jan. 24, 1997

[51] Int. Cl.[6] .......... B08B 6/00; H01L 21/302

[52] U.S. Cl. .......... 134/1.2; 438/723; 438/734; 438/743

[58] Field of Search .......... 134/1.2; 438/710, 438/723, 734, 743

[56] References Cited

U.S. PATENT DOCUMENTS 4,617,193 10/1986 Wu .......... 427/38
4,833,096 5/1989 Huang et al. .......... 437/29
5,348,619 9/1994 Bohannon et al. .......... 156/664

OTHER PUBLICATIONS

S. Wolf et al. "Silicon Processing For the VLSI Era, vol. 1" Lattice Press, Sunset Beach, CA, pp. 563–564.

*Primary Examiner*—Robert Kunemund
*Assistant Examiner*—George Goudreau
*Attorney, Agent, or Firm*—George O. Saile; Stephen B. Ackerman

[57] ABSTRACT

An improved process is described for the post-etching treatment after subtractive etching of aluminum and aluminum-alloy layers in the fabrication of semiconductor integrated circuit devices. The improvement consists of in situ exposure immediately after subtractive etching of the metal pattern to a reactive plasma sustained in a mixture of oxygen and carbon tetrafluoride gases by continuous radiofrequency power input for a controlled period of time.

14 Claims, 2 Drawing Sheets

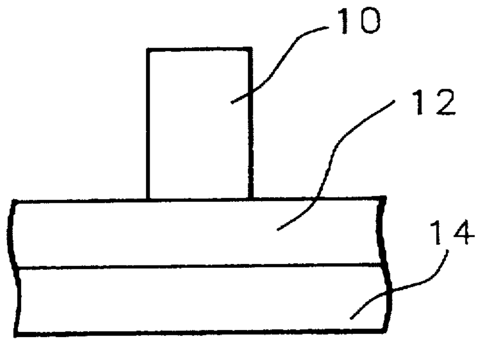
FIG. 1a – Prior Art
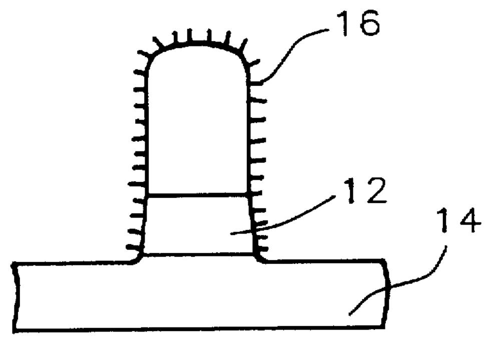
FIG. 1b – Prior Art
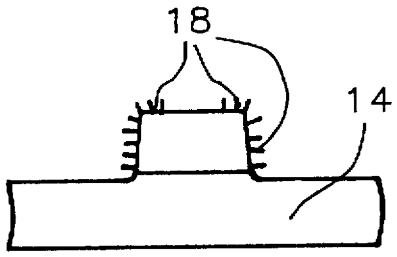
FIG. 1c – Prior Art

METHOD FOR POST-ETCHING OF METAL PATTERNS

BACKGROUND OF THE INVENTION (1) Field of the Invention

This invention relates to the manufacture of integrated circuits, and more particularly to the formation of device interconnections on semiconductor integrated circuits by subtractive etching of a metal layer with gaseous reagents assisted by electrical plasma excitation of the reactive medium.

(2) Description of the Prior Art

In the fabrication of semiconductor integrated circuits, patterns of fine conductive lines are required to interconnect electronic devices thereon, in order to carry electrical signals and to distribute electrical current and power to the devices. It is very desirable to use metals of high electrical conductivity for this purpose to minimize power loss and undesirable heating. The preferred materials for this purpose are aluminum and its alloys, particularly with copper. The economic benefit from reducing overall device dimensions derives from the lower unit cost per device if more devices can be fabricated per unit area of semiconductor substrate. The desire for finer lines follows directly, and has resulted in the development of methods for accurate and precise fabrication of metallic linewidths and spacings of the order of several microns. This is accomplished by methods of subtractive etching of the metallic layers by means of gas-phase removal of the metallic material selectively exposed by an appropriate photoresist pattern. This process is often enhanced and improved by carrying it out in the presence of an electrical plasma sustained in the reactive gaseous etching mixture by input of radiofrequency power to the reaction chamber. The desired high rates and selectivity of etching of aluminum and its alloys are readily attained by use of gaseous compounds containing chlorine such as chloroform (CHCl3), for example. However, such subtractive gas-phase etching of aluminum can leave a residue of Cl-containing species on the etched pattern, particularly on the sidewalls of the etched aluminum lines. This residue is inaccessible to routine cleaning procedures such as rinsing, etc. with water or solvents. Incomplete removal of such Cl-containing material followed by reaction such as hydrolysis from any residual water can generate corrosive substances such as hydrogen chloride (HCl) which react with aluminum to form aluminum chloride (AlCl3). This compound in turn can react with moisture to release Cl atoms, continuing the cyclic process which corrodes the aluminum lines. In addition, the presence of copper in the metallic material can result in the formation of the compound CuAl2, which forms a galvanic couple with the metal and leads to enhancement of the corrosion because of the electrochemical reaction taking place.

Another problem which is associated with the plasma-enhanced gas-phase subtractive etching of aluminum and its alloys by photolithographic means is the formation of polymeric residues by reaction of the various reactants and products present. This leads to the formation of surface residues on the integrated circuits and on the surfaces of the reaction chamber, as well as solid particulates in the reactor atmosphere. Such residues are potentially harmful, as they act to trap the residual Cl species which can lead to corrosion as already described. In addition, such polymer residues are often insoluble and can coat the photoresist of the pattern with an intractable skin of material, hindering subsequent removal of the photoresist mask. The polymer coating of the interior surfaces of the reaction chamber and particulate generation necessitates eventual removal and exposes personnel to Cl-containing material on opening the chamber after processing the devices, which is a potential safety hazard to operating personnel. Although the polymerization of the various species present during subtractive etching occurs while the plasma is active, the rate may be even more rapid after the stimulating energy is turned off. Hence, the interruption of the RF power input may result in even further deposition of polymer residues due to the interruption of competing reactions in the plasma and the cessation of surface heating by the plasma which had led to surface evaporation of some portion of the plasma.

For the reasons cited, it has been found beneficial to carry out a post-etching procedure subsequent to metal pattern etching. Removal of the device substrates from the reaction chamber followed by exposure to solvent or aqueous cleaning media has been one solution. Another procedure has been a subsequent exposure of the devices to a RF plasma sustained in an oxygen (O2) gas environment , which has been found to be beneficial in removing residues containing trapped Cl-containing species, and in minimizing the amount of intractable polymer surface skin on the photoresist which interferes with the stripping of the latter material. It has been reported that the use of fluorine-containing gases provides a suitable post-etching treatment for reducing Cl-containing residues after gas-phase etching of aluminum ("Silicon Processing for the VLSI Era, Vol. 1, Wolf and Tauber, Lattice Press, Sunset Beach, Calif., 1986, p. 563). It is thought that this process substitutes F atoms for the Cl atoms in the residues, or coats the residues with an impervious fresh polymer and limits access to the trapped Cl atoms by water.

SUMMARY OF THE INVENTION

It is an object of the invention to describe an improved post-etching process subsequent to the plasma-activated gas-phase subtractive etching of aluminum and its alloys into fine-line patterns for integrated circuit fabrication which minimizes the risk of subsequent corrosion of the metallic material by residual Cl-containing species. It is a further object of the invention to describe an improved process for removal of residual polymeric residues from the surfaces of integrated circuit devices and the chamber used for device fabrication steps such as subtractive etching, which facilitates removal of various residues of the fabrication process such as photoresist, and results in a cleaner reaction with less safety risk to personnel. In accordance with the objects of the invention, an improved process is described for the post-etching treatment after gas-phase subtractive etching of aluminum and aluminum alloys in fabrication of integrated circuit devices. The improvement consists of in situ exposure of the metal pattern immediately after etching to a reactive plasma sustained in a mixture of oxygen and carbon tetrafluoride gases by a continuous and uninterruipted input of radiofrequency power for a controlled period of time.

BRIEF DESCRIPTION OF THE DRAWINGS

FIG. 1*a–c* is a schematic cross-sectional depiction of the subtractive etching and post-etching process of the prior art.

DESCRIPTION OF THE PREFERRED EMBODIMENT

Figure 2A:
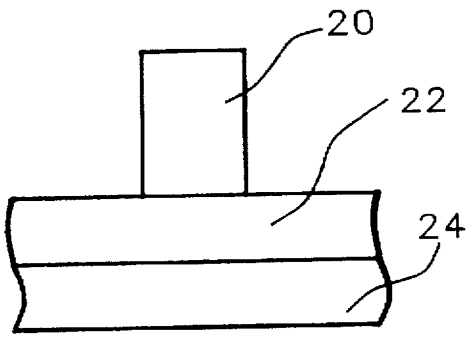
FIG. 2*a–d* is a schematic cross-sectional depiction of the post-etching process of the invention.

Referring now more particularly to FIG. 1*a–c*, there is shown a schematic cross-sectional diagram depicting the subtractive etching and post-etching procedure for fabricating metal interconnections for integrated circuits of the prior art. FIG. 1*a* illustrates the positioning of the photoresist mask 10 for the interconnection pattern to be etched in the metal layer 12. In FIG. 1*b*, the pattern etching has been completed, leaving a residue layer 16 on the surface of the partially eroded photoresist pattern and on the sidewall of the metal layer. The underlying silicon oxide layer 14 has been slightly etched. Finally, FIG. 1*c* shows the remaining structure after stripping of the photoresist mask, indicating some residues still remaining of the photoresist 18 and on the metal pattern sidewall. This residue is only removeable with difficulty by exposure to solvent or aqueous cleaning steps or by exposure to a fluorine-containing plasma or other gas-phase treatment which may in fact cover over the residues with a surface polymer coating rather than actually removing them.

Figure 2B:
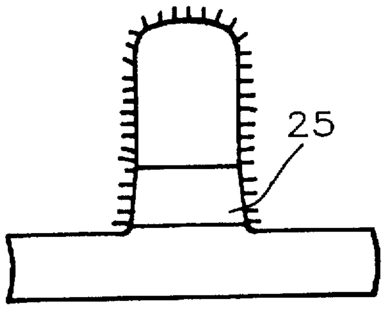
Figure 2C:
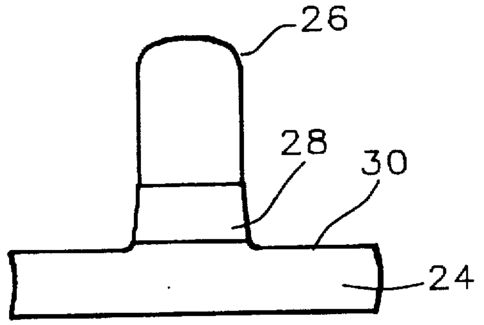
Figure 2D:
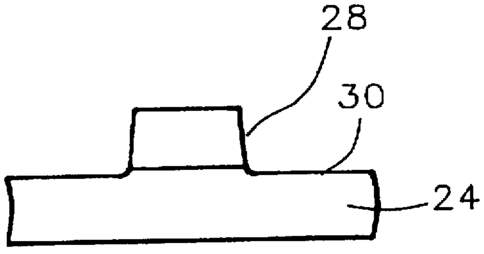

The process of the invention is shown by reference to FIG. 2*a*–*d*, which is a schematic cross-sectional depiction of an improved post-etching process after subtractive etching of the metal layer into the interconnection pattern of an integrated circuit. FIG. 2*a* illustrates the photo-resist pattern 20 in place of the metal layer 22 on the surface of silicon oxide 24. In FIG. 2*b* is shown the resulting etched metal pattern 26 immediately after subtractive etching. The device substrate is kept in place in situ in the reaction chamber, and is exposed to a reactive plasma sustained by radiofrequency power input at 13.56 mHz in a mixture of oxygen (O2) and carbon tetrafluoride (CF4) or other fluorine-containing gases for a period of time. The result is shown in FIG. 2*c*, which illustrates the removal of the surface residues from the photoresist mask 26, the metal pattern sidewalls 28, and the oxide surface 30. The oxide is slightly etched further but in a completely controllable manner. Finally, in FIG. 2*d*, the device cross-sectional diagram shows the removal of the photoresist mask by stripping, for example, in an oxygen ashing process, with the complete absence of residues of any sort on any of the device surfaces.

The conditions for the post-etching procedure are not critical, and typical process parameters are given in the example:

EXAMPLE I

RF power(continuous 13.56 mHz): 100–800 watts substrate temperature: 20°–80° C.

$CF_4/O_2$ pressure: 6–300 mtorr exposure time: 6–30 seconds $CF_4O_2$ flow rate: 40/10 to 80/50 standard cubic centimeters/second While $CF_4$ is the preferred fluorine compound for the improved post-etch process, the use of other compounds of fluorine is also possible. Thus such gaseous compounds as hexafluoroethane ($C_2F_6$) and sulfur hexafluoride ($SF_6$) could also be used in place of $CF_4$ for example. It is important for optimum results that the semiconductor integrated circuit devices not be removed from the chamber between subtractive etching and post-etch processing, and that the interval between these steps be limited to the time required to remove the etching gases to prepare for the post-etching exposure. Likewise, the RF power input during the post-etch exposure is not to be interrupted, as this is likely to result in an undesired deposition of further polymeric material on the surfaces to be cleaned. The combination of fluorine compounds with oxygen gas in an in situ process for both Cl-containing residue removal and the removal of a residual surface polymer skin from the photoresist layer by continuous RF power input result in the cleanup of residual polymer from the walls of the chamber and a concomitant improvement in safety upon opening of the chamber at the completion of the process.

While the invention has been particularly shown and described with reference to the preferred embodiments thereof, it will be understood by those skilled in the art that various changes in form and details may be made without departing from the spirit and scope of the invention.

What is claimed is:

1. A method in the fabrication of semiconductor integrated circuits for improved post-etch processing after subtractive etching of a metal interconnection patterns comprising the steps of;

subtractive etching of substantially all of said metal interconnection pattern in a reactive gas plasma;

exposing integrated circuit device substrates in situ immediately after said subtractive etching of the metal interconnection pattern in a reactive gas plasma containing a fluorine compound, while continuously maintaining radio frequency power input during said subtractive etching and during said exposing steps, wherein said fluorine compound removes surface residues on the metal pattern; and removing photoresist pattern mask residues by stripping in an oxygen plasma.

2. The method of claim 1 wherein said metal layer is selected from the group consisting of aluminum and aluminum alloys.

3. The method of claim 2 wherein said aluminum alloys are those of aluminum with copper or silicon.

4. The method of claim 1 wherein said reactive gas plasma is sustained in a gas mixture comprising carbon tetrafluoride and oxygen.

5. The method of claim 1 wherein said radiofrequency power input is at a frequency of 13.56 mHz from between about 100 to 800 watts.

6. The method of claim 1 wherein said removing of surface residues is achieved by an exposure time of between about 6 to 30 seconds at a device temperature of between about 20° to 80° C.

7. The method of claim 4 wherein said mixture of oxygen and fluorine-containing gases is at a total gas pressure of between about 6 to 300 mtorr.

8. The method of claim 4 wherein said reactive gas mixture of fluorine-containing and oxygen gases is in the ratio of between about 40/10 and 80/50 standard cubic centimeters/second respectively.

9. A method in the fabrication of silicon integrated circuits for improved removal of surface layers of deposited residual materials occurring during subtractive etching of aluminum, aluminum-copper, and aluminum-copper-silicon alloys layers into interconnection patterns comprising the steps of:

maintaining silicon device substrates in situ in a reaction chamber after subtractive etching substantially all of the metal pattern in a chlorine-containing gas plasma;

pumping out the reaction chamber;

exposing the silicon device substrates to a reactive gas plasma containing a fluorine compound;

maintaining radio frequency power in a continuous and uninterrupted manner during said subtractive etching and said exposing to a plasma containing a fluorine compound, whereby surface residues are removed from the silicon devices and the interior surfaces of the reaction chamber; and removing photoresist pattern mask residue by stripping in an oxygen plasma.

10. The method of claim 9 wherein said radio-frequency power input is operated at a frequency of 13.56 mHz at between about 100 to 800 watts.

11. The method of claim 9 wherein said removal of surface residues and silicon oxide layer surface is accomplished by exposure time of between about 6 to 30 seconds.

12. The method of claim 9 wherein said reactive gas consists of a mixture of oxygen and carbon tetrafluoride at a total pressure of between about 6 to 300 mtorr.

13. The method of claim 9 wherein said reactive gas mixture of oxygen and carbon tetrafluoride is in a ratio of between about 10/40 and 50/80 standard cubic centimeters/second respectively.

14. The method of claim 9 wherein said silicon substrates are maintained at a temperature of between about 20° to 80° C. during the post-etch process.

* * * * *